United States Patent [19]
Han et al.

[11] Patent Number: 6,033,925
[45] Date of Patent: Mar. 7, 2000

[54] METHOD FOR MANUFACTURING A SOI-TYPE SEMICONDUCTOR STRUCTURE

[75] Inventors: Chul-Hi Han; Hi-Deok Lee; Jae-Kwan Kim, all of Taejon, Rep. of Korea

[73] Assignee: Korea Advanced Institute of Science and Technology, Taejon, Rep. of Korea

[21] Appl. No.: 08/864,551

[22] Filed: May 27, 1997

[30] Foreign Application Priority Data

May 27, 1996 [KR] Rep. of Korea ....................... 96-17990

[51] Int. Cl.⁷ ............................................... H01L 21/3063
[52] U.S. Cl. ........................... 438/30; 438/459; 438/977; 349/187
[58] Field of Search ............................... 438/30, 406, 459, 438/977, FOR 485, FOR 107, 466, 408; 349/187

[56] References Cited

U.S. PATENT DOCUMENTS

| | | |
|---|---|---|
| 4,983,251 | 1/1991 | Haisma et al. . |
| 5,455,202 | 10/1995 | Malloy et al. . |
| 5,591,678 | 1/1997 | Bendik et al. . |
| 5,633,176 | 5/1997 | Takasu et al. . |
| 5,728,591 | 3/1998 | Takahashi et al. . |
| 5,741,733 | 4/1998 | Bertagnolli et al. . |
| 5,786,242 | 7/1998 | Takemura et al. . |
| 5,807,783 | 9/1998 | Gaul et al. . |
| 5,827,755 | 10/1998 | Yonehara et al. . |

OTHER PUBLICATIONS

J.–B. Yoon et al., New Single–crystal–Silicon AMLCD Technology, SID 95 Digest, pp. 321–324(1995).
K.R. Sarma et al., Silicon–on–Quartz (SOQ) for high–Resolution Liquid–Crystal Light Valves, SID 94 Digest, pp. 419–422(1994).
J.P. Salerno et al., Late–News Paper: Single–crystal Silicon Transmissive AMLCD, SID 92 Digest, pp. 63–66(1992).
Edward Stupp, Projection Displays Take Off, Information Display, Oct. 1996:20–24(1996).
J.P. Salerno, Single Crystal Silicon AMLCDs, Conference Record of the 1994, International Display Research Conference, 39–44 (1994).

*Primary Examiner*—George Fourson
*Attorney, Agent, or Firm*—Knobbe, Martens, Olson & Bear LLP

[57] ABSTRACT

The present invention relates to a method for manufacturing a semiconductor wafer having a SOI wafer-like structure which is prepared on a silicon substrate by electrochemical etching, and an active-driven liquid crystal display employing the semiconductor wafer as a pixel switching wafer. In accordance with the method for manufacturing the SOI-type semiconductor wafer, a wafer having a good electrical insulation property, low leakage current and small parasitic capacity, like a SOI wafer, can be prepared, by employing a silicon substrate which is cheaper than the SOI substrate.

20 Claims, 14 Drawing Sheets

METHOD FOR MANUFACTURING A SOI-TYPE SEMICONDUCTOR STRUCTURE

FIELD OF THE INVENTION

The present invention relates to a method for manufacturing a semiconductor structure having a silicon on insulator(SOI) structure and an active-driven liquid crystal display employing the same, more specifically, to a method for manufacturing a semiconductor structure having a SOI wafer-like structure which is prepared on a silicon substrate by electrochemical etching, and an active-driven liquid crystal display employing the semiconductor device as a pixel switching wafer.

BACKGROUND OF THE INVENTION

In line with recent advent of the information-intensive society, visualized displays have been given much more weight as means for connecting human being with machines by the informational exchange. Specifically, small-sized flat displays which can work by low electric power have been widely used in electronic calculators, watches, toys and notebook computers, and so on.

Among the various flat displays, a liquid crystal display (hereinafter referred to as 'LCD') is fallen within a passive light-emitting display. That is, image is created on a screen by changing exterior light path or by modulating density of passing light instead of direct light emission. Thus, LCD has various advantages that: electric power consumption is low, its size is small, operation is possible under a relatively low voltage, and image on a screen does not disappear during incidence of bright light onto a screen. Therefore, LCD has enjoyed the distinction as a flat display which has been widely used in the art.

The LCD is further classified into a passive-driven display and an active-driven display, depending on its driving mode: Passive-driven LCD drives liquid crystal only by electrodes without employing a specific wafer in a pixel, and has advantages of simplicity and inexpensiveness, while it has also disadvantages that improper ratio of light and shade gives rise to darkness, and low response speed results in afterimage. On the contrary, active-driven LCD developed by combining the conventional liquid crystal technology with semiconductor technology has excellent properties of screen display, in light of high definition, wide view angle, improved color quality and use of relatively quick liquid crystal.

Recently developed active-driven LCDs have a structure that a transparent electrode is formed in each pixel on a glass plate, and liquid crystal is coated on the electrode. Thus, application of voltage to the transparent electrode leads to the change in polarization of the liquid crystal on the electrode, which, in turn, modulates brightness of each pixel. Control of the transparent electrode is accomplished by a pixel switching device prepared on the glass plate.

On the other hand, thin film-type transistor which is a pixel switching device of an active-driven LCD, being made of polycrystalline silicon, amorphous silicon, etc., has been proven less satisfactory in the sense that it has bad electrical properties, compared to the conventional devices prepared with single crystalline silicon. Nevertheless, the polycrystalline silicon has been employed to manufacture a device on a glass plate accompanying with the improvement of its properties, since single crystalline silicon can not be grown on a glass plate, which is essentially required for light transmission in the course of manufacturing a transparent LCD. However, during the preparation of substrate using conventional glass plates, deformation of the glass may occur at a high temperature. Accordingly, quartz of high price has to be used in order to carry out the process at a high temperature which is a critical step for the improvement of electrical properties. However, the devices prepared with quartz have still worse properties than devices made of single crystalline silicon in light of operation speed, etc.

Consequently, if single crystalline silicon substrate can be used in the manufacture of LCDs, the following advantages would be expected: integration of driving circuit and extra circuit is facilitated; recently developed integration techniques can be employed to manufacture small-sized devices; high resolution and high level of integration can be accomplished; and, electric power consumption can also be reduced.

In general, a silicon on insulator(SOI) device which is prepared in a single crystalline silicon region on oxidized silicon layer, has merits of good electrical insulation properties, low leakage current and small parasitic capacity, compared to wafers prepared simply on single crystalline silicon, though SOI substrates used therein are more expensive than common silicon substrates.

SUMMARY OF THE INVENTION

The present inventors have made an effort to solve the problems of the prior art devices, and discovered that a SOI-type semiconductor device having a structure similar to a SOI wafer can be prepared, by the formation of an electric device on a silicon substrate and electrochemical etching of the regions except for the device, and manufactured an active-driven liquid crystal display employing the wafer.

A primary object of the present invention is, therefore, to provide a method for manufacturing a SOI-type semiconductor structure.

The other object of the invention is to provide an active-driven liquid crystal display employing the SOI-type semiconductor device.

BRIEF DESCRIPTION OF DRAWINGS

The above and the other objects and features of the present invention will become apparent from the following description give in conjunction with the accompanying drawings, in which.

DETAILED DESCRIPTION OF THE INVENTION

A method for manufacturing a SOI-type semiconductor device of the present invention comprises the following steps:

Step 1: Pattern for silicon layer is formed on a silicon substrate.

Step 2: Electric wafer is formed on the silicon substrate.

Step 3: The pattern for silicon layer is exposed on the silicon substrate, and metallic layer for electrochemical etching is evaporated.

Step 4: Insulating layer is formed on the silicon substrate to complete the formation of electric devices, and then an insulating structure is attached thereon.

Step 5: The silicon substrate is placed on the bottom of a reactor containing a silicon etching solution under a state that back-side of the substrate faces the solution, and the reactor is sealed. Then, power is supplied between the silicon substrate and platinum which is an anode positioned in the silicon etching solution, and current or voltage is applied to carry out eletrochemical etching of the silicon substrate, which gives rise to the formation of a silicon layer.

In accordance with the method for manufacturing the SOI-type semiconductor device of the invention, electric devices include at least one selected from the group consisting of diode, bipolar junction transistor(BJT), N-channel metal oxide semiconductor(NMOS), P-channel metal oxide semiconductor(PMOS), complementary metal oxide semiconductor(CMOS), NPN bipolar transistor and PNP bipolar transistor, which are positioned on the silicon layer and/or the silicon substrate. Also, metallic layer is evaporated in a thickness of 0.001 to 100 $\mu$m, by using one or more material selected from the group consisting of aluminum, tungsten, chrome, nickel, titanum, tantalum, copper, gold and platinum sequentially, or by using a mixture of two or more of the materials. Further, a glass plate, a quartz plate or a silicon substrate is used as the insulating structure, and a fluoric acid solution or a solution containing fluoric acid and nitric acid is used as the etching solution. The silicon substrate is electrochemically etched in a reactor containing one or more etching solutions sequentially.

The method for manufacturing the SOI-type semiconductor device of the invention is explained in more detail, in accordance with the following steps:

(i) a silicon oxide film and a silicon nitride film are formed on a silicon substrate, and parts of the silicon oxide film and the silicon nitride film are removed to make windows;

(ii) a phosphorous ion-diffused(or implanted) layer is formed on the silicon substrate exposed by the formation of windows;

(iii) a silicon oxide film is formed on the ion-diffused layer;

(iv) parts of the silicon oxide film and the silicon nitride film are removed to make windows;

(v) a boron ion-diffused layer is formed on the silicon substrate exposed by the formation of windows;

(vi) a silicon oxide film is formed on the boron ion-diffused layer;

(vii) the silicon oxide film and the silicon nitride film are removed to make windows, and a boron ion-diffused layer is formed on the silicon substrate exposed by the formation of windows;

(viii) a gate silicon oxide film is formed on the silicon substrate exposed by the formation of windows;

(ix) a polycrystalline silicon layer is formed on a part of the silicon oxide film;

(x) an ion-diffused layer is formed on the silicon substrate positioned under the silicon oxide film which is free of the polycrystalline silicon layer;

(xi) a silicon oxide film is formed on the ion-diffused layer;

(xii) parts of the region consisting of the silicon oxide film, the ion-diffused polycrystalline silicon layer and the gate silicon oxide film are etched to form a window for silicon etching;

(xiii) a metallic layer is formed on the silicon substrate exposed by the formation of window;

(xiv) a protective layer is formed on the silicon substrate;

(xv) parts of the silicon oxide film on the silicon substrate are removed to make windows;

(xvi) a metallic layer is formed on the silicon substrate exposed by the formation of windows to form NMOS transistor;

(xvii) a transparent glass is attached onto the silicon substrate having NMOS transistor; and, (xviii) parts of the silicon substrate are electrochemically etched to expose parts of the metallic layer.

On the other hand, an active-driven liquid crystal display of the invention is manufactured by a method comprising the following steps:

Step 1: Pattern for silicon layer is formed on a silicon substrate.

Step 2: Electric device is formed on the silicon substrate.

Step 3: The pattern for silicon layer is exposed on the silicon substrate, and metallic layer for electrochemical etching is evaporated.

Step 4: Insulating layer and transparent conductive layer are formed on the silicon substrate to complete the formation of electric device, and then an insulating structure is attached thereon.

Step 5: The silicon substrate is placed on the bottom of a reactor containing a silicon etching solution under a state that back-side of the substrate attached with the insulating structure faces the solution, and the reactor is sealed. Then, current or voltage is applied between the silicon substrate and platinum which is an anode positioned in the silicon etching solution, to etch the silicon substrate and to form a silicon layer.

Step 6: The metallic layer is removed to expose the transparent conductive layer.

Step 7: The insulating structure is attached with the other insulating structure having the transparent conductive layer.

Step 8: Liquid crystal is implanted between the insulating structures.

In the method for manufacturing the active-driven LCD of the invention, at least one material selected from the group consisting of indium tin oxide(ITO), ZnO and $SnO_2$ is used as the transparent conductive layer, and twist nematic(TN) or super twist nematic(STN) liquid crystal is used as the liquid crystal.

The method for manufacturing the active-driven LCD of the invention is explained with more detailed steps:

(i) A silicon oxide film and a silicon nitride film are formed on a silicon substrate, and parts of the silicon oxide film and the silicon nitride film are removed to make windows;

(ii) A phosphorous ion-diffused(or implanted) layer is formed on the silicon substrate exposed by the formation of windows;

(iii) A silicon oxide film is formed on the ion-diffused layer;

(iv) Parts of the silicon oxide film and the silicon nitride film are removed to make windows;

(v) A boron ion-diffused layer is formed on the silicon substrate exposed by the formation of windows;

(vi) A silicon oxide film is formed on the boron ion-diffused layer;

(vii) The silicon oxide film and the silicon nitride film are removed to make windows, and a boron ion-diffused layer is formed on the silicon substrate exposed by the formation of windows;

(viii) A gate silicon oxide film is formed on the silicon substrate exposed by the formation of window;

(ix) A polycrystalline silicon layer is formed on parts of the silicon oxide film;

(x) An ion-diffused layer is formed on the silicon substrate under the silicon oxide film which is free of the polycrystalline silicon layer;

(xi) A silicon oxide film is formed on the ion-diffused layer;

(xii) Parts of the region consisting of the silicon oxide film, the ion-diffused polycrystalline silicon layer and the gate silicon oxide film are etched to form window for silicon etching;

(xiii) A metallic layer is formed on the silicon substrate exposed by the formation of window;

(xiv) A protective layer is formed on the silicon substrate;

(xv) A transparent conductive layer is formed on a part of the silicon substrate;

(xvi) Parts of the silicon oxide film on the silicon substrate are removed to make windows;

(xvii) A metallic layer is formed on the silicon substrate exposed by the formation of windows to form NMOS transistor;

(xviii) A transparent glass is attached onto the silicon substrate having NMOS transistor;

(xix) The silicon substrate is electrochemically etched from the back-side to form a silicon layer, and parts of the metallic layer are exposed;

(xx) A glass having transparent conductive layer is attached under the silicon substrate; and, (xxi) Liquid crystal is implanted between the silicon substrate and the glass.

Preferred embodiments of the present invention are explained in more detail with references of the accompanying drawings, which should not be taken to limit the scope of the invention.

Figure 1A:
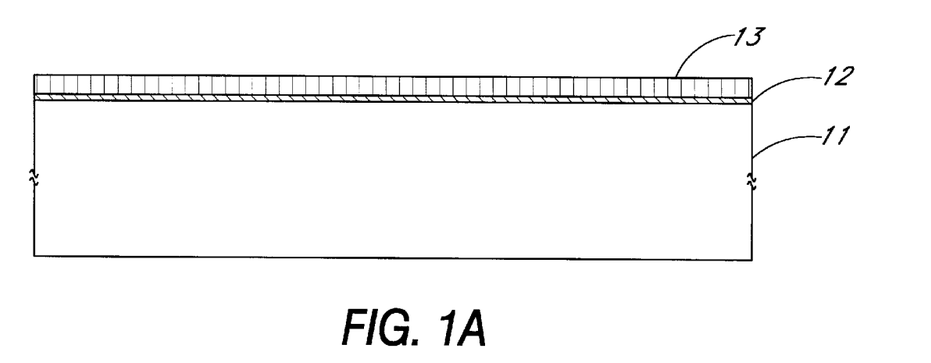
FIGS. 1A to 1Q are schematic diagrams showing a method for manufacturing a NMOS transistor of SOI-type, employing an electrochemical etching method.
Figure 1B:
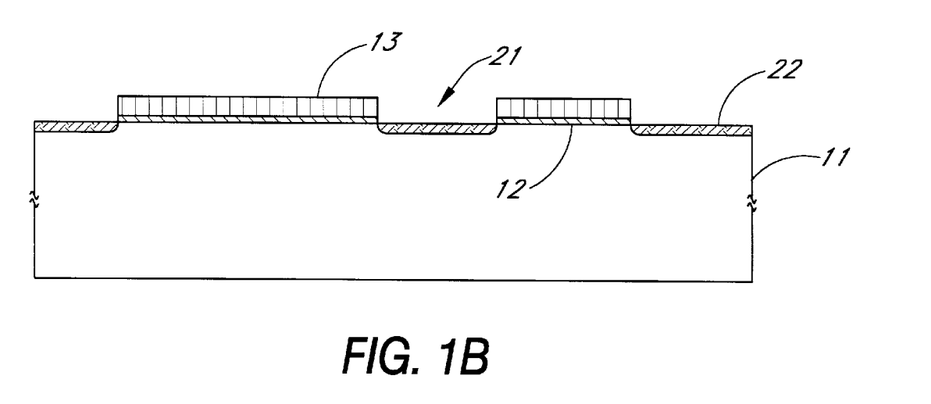
Figure 1C:
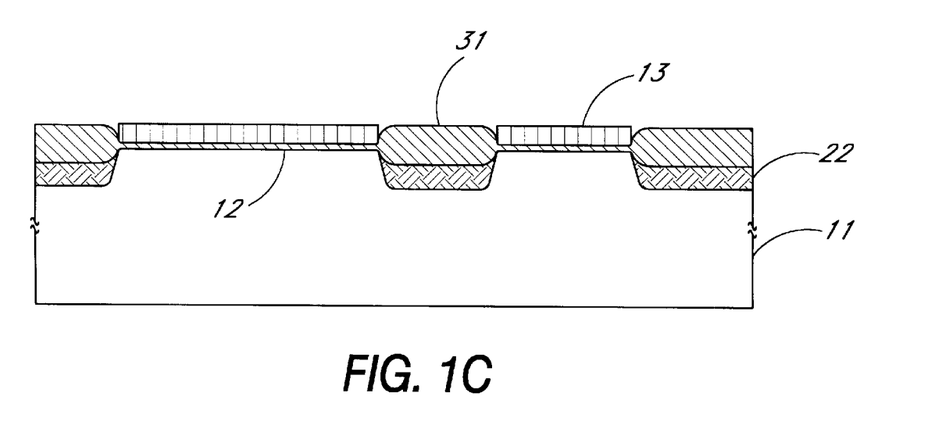
Figure 1D:
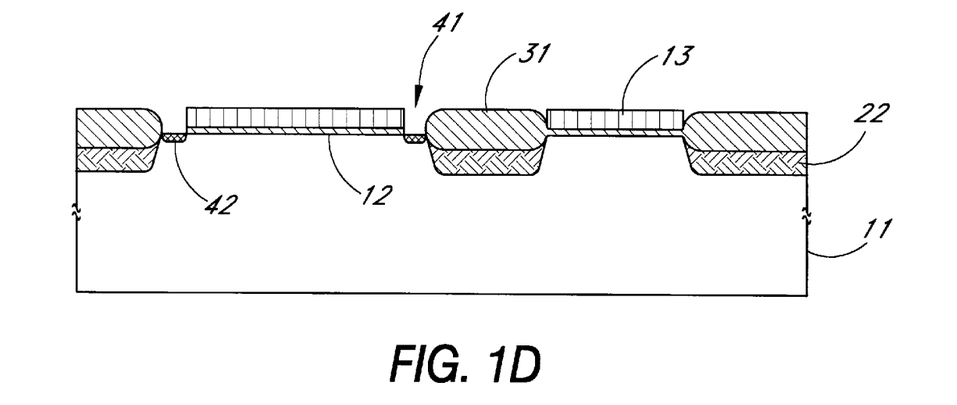
Figure 1E:
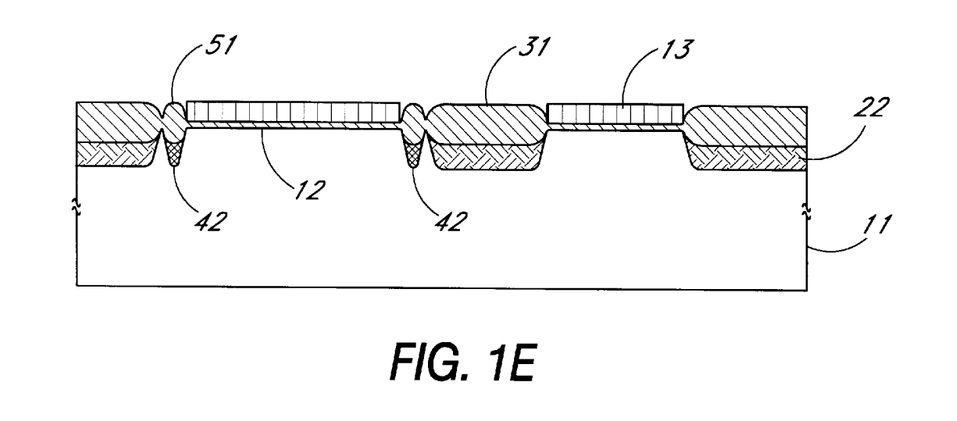
Figure 1F:
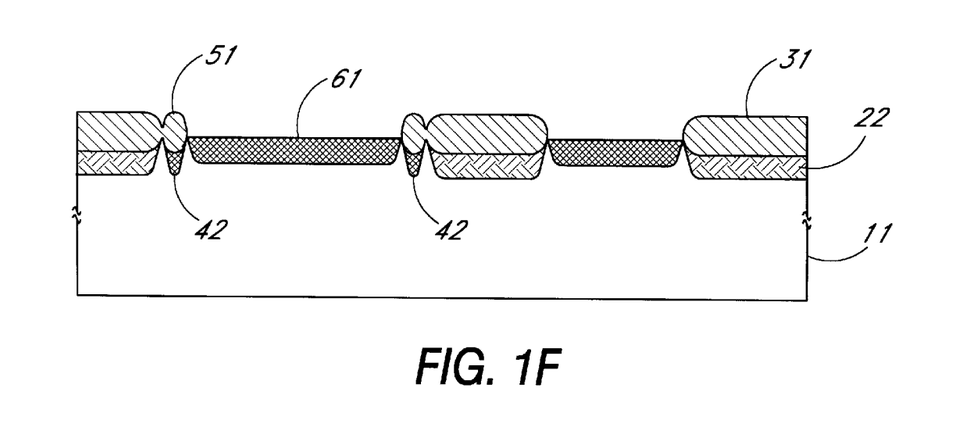
Figure 1G:
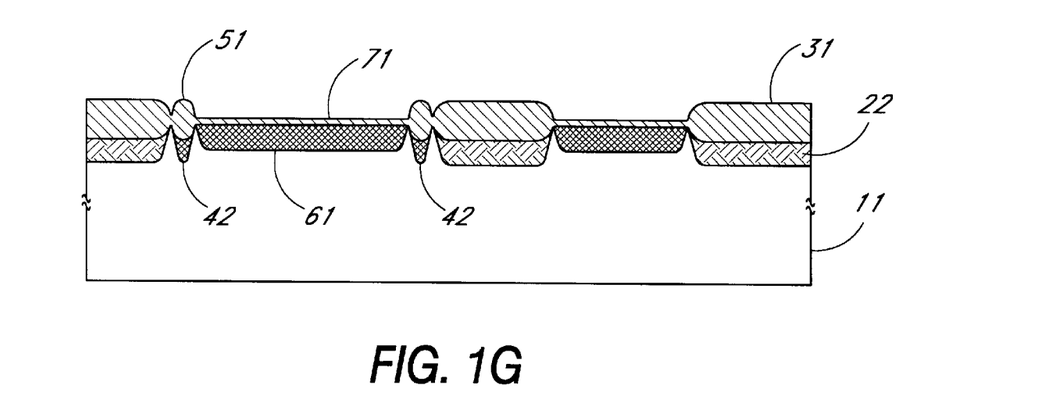
Figure 1H:
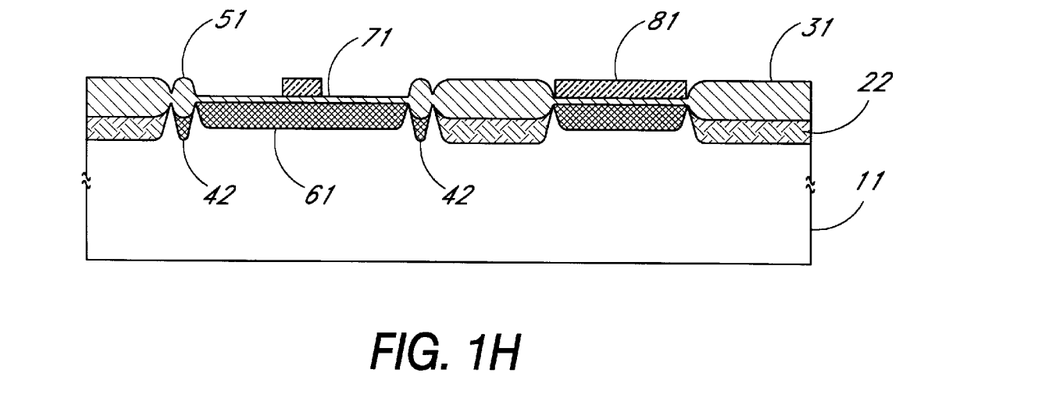
Figure 1I:
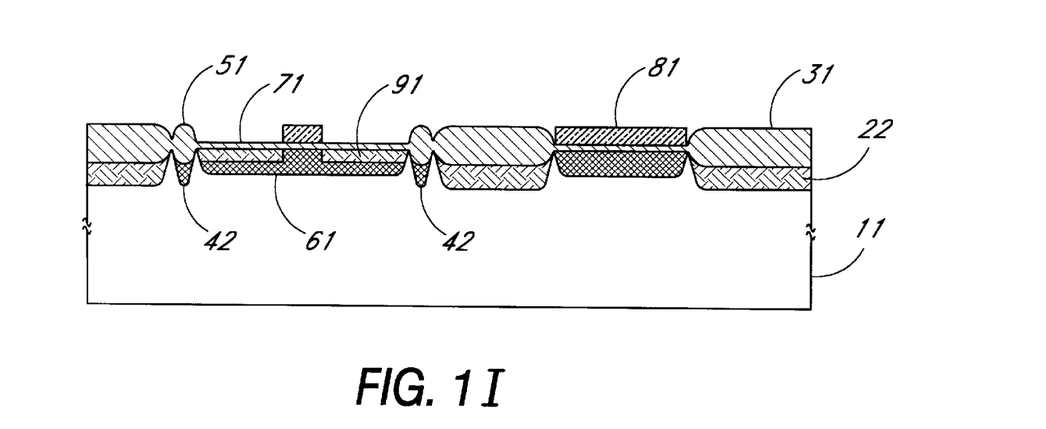
Figure 1J:
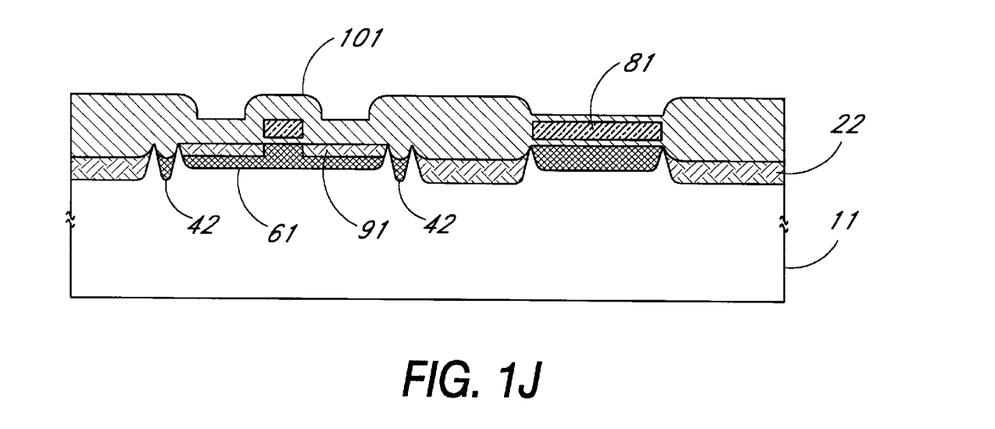
Figure 1K:
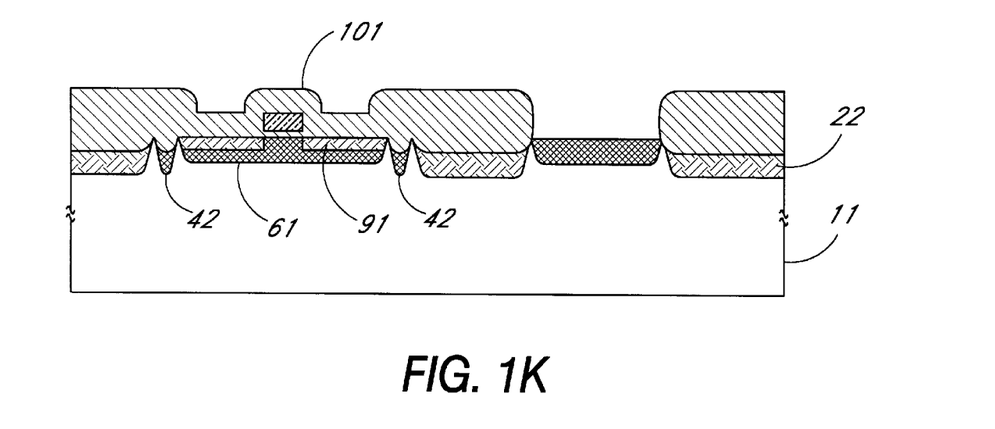
Figure 1L:
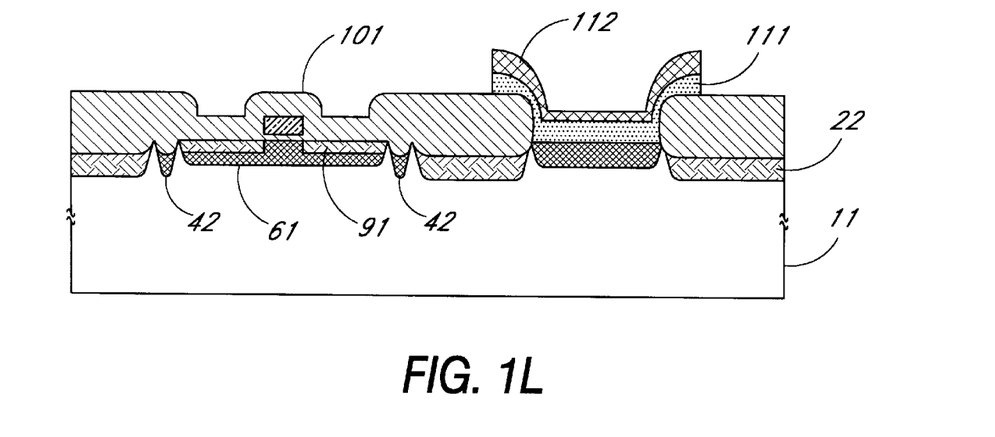
Figure 1M:
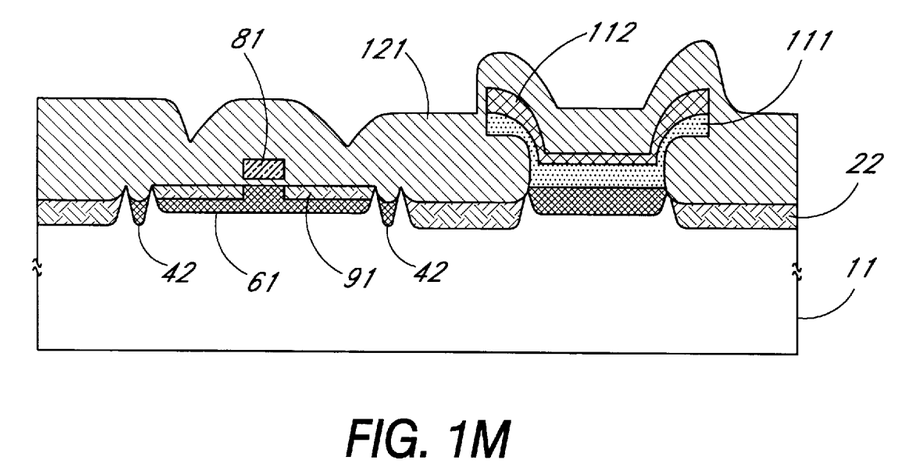
Figure 1N:
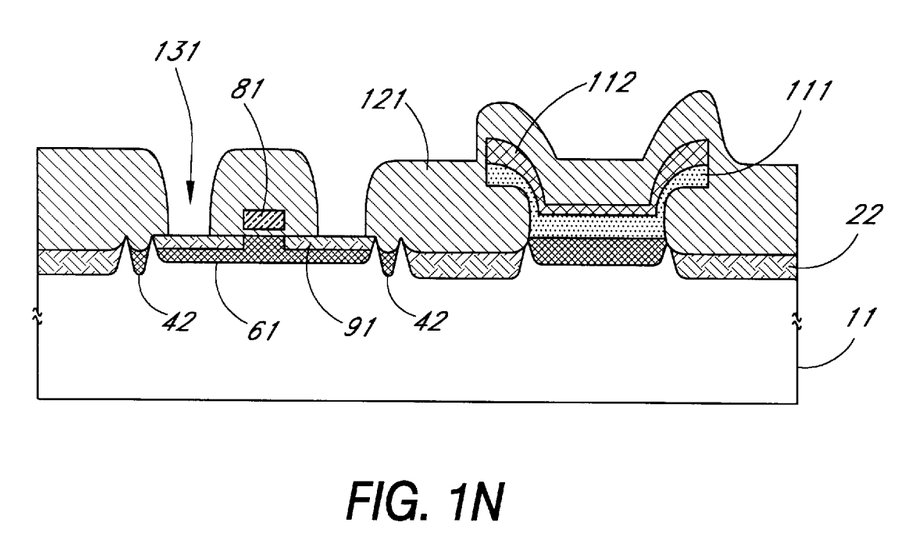
Figure 1O:
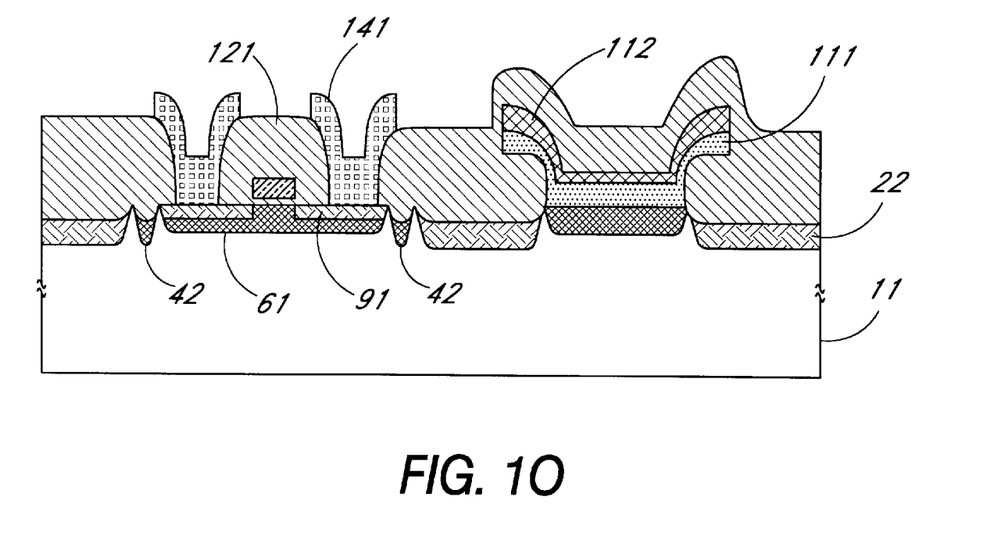
Figure 1P:
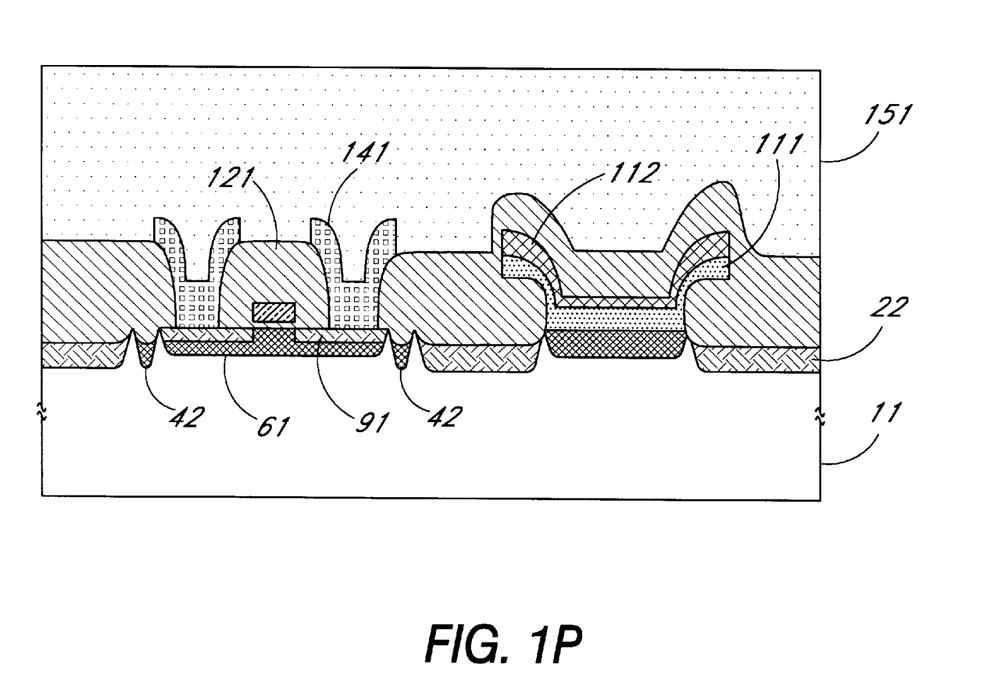
Figure 1Q:
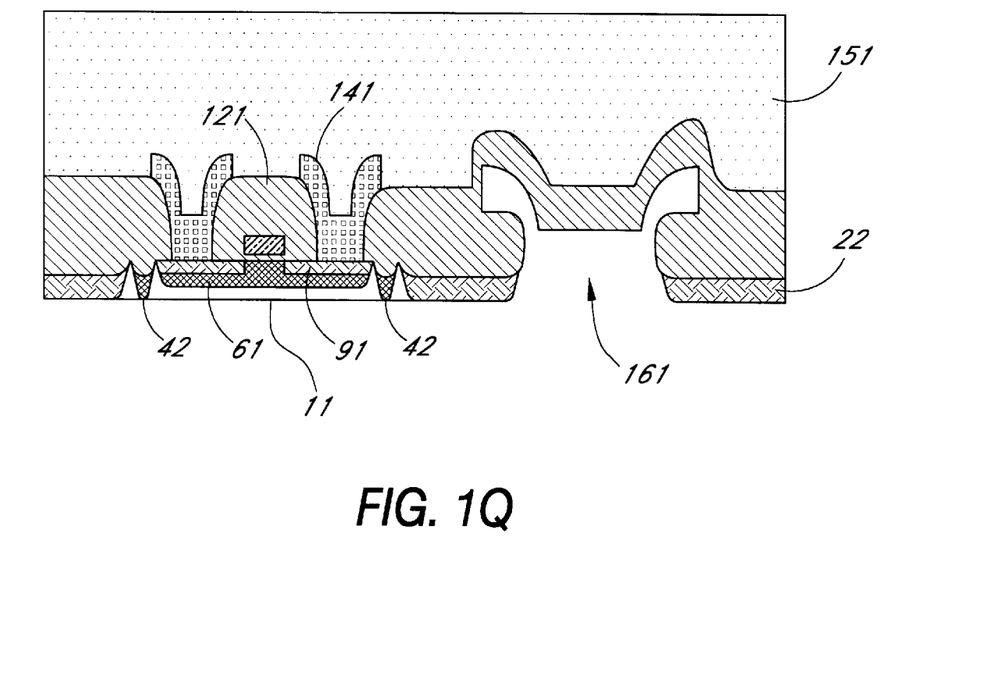

The method for manufacturing the SOI-type semiconductor structure of the present invention is explained with references of FIGS. 1A to 1Q. In accordance with the invention, semiconductive devices such as diode, BJT, NMOS transistor, PMOS transistor, CMOS transistor, etc. can be manufactured, though a NMOS transistor is shown and illustrated as a preferred embodiment of the invention.

Referring to FIG. 1A, a silicon oxide film(12) is grown on a silicon substrate of p-type(11), and a silicon nitride film (13) is formed on the silicon oxide film(12). Then, as can be seen in FIG. 1B, windows(21) are made on the substrate(11) by removing the silicon oxide film(12) and the silicon nitride film(13), and phosphorous ion-diffused layers(22) are formed on the silicon substrate(11) exposed by the formation of windows (21) . Silicon oxide film(31) is grown on the ion-diffused layers(22) by oxidizing it again at a high temperature, to grow silicon oxide film(31) while regions under the silicon nitride film(13) are not oxidized(see: FIG. 1C).

Then, windows(41) are made by removing the silicon oxide film(12) and the silicon nitride film(13), as can be seen in FIG. 1D. Boron ion-diffused layers(42) are formed on the windows(41) and oxidized at a high temperature, to form silicon oxide films(51) for the insulation of NMOS transistor devices(see: FIG. 1E).

Referring to FIG. 1F, the remaining silicon nitride films (13) and the silicon oxide films(12) under the silicon nitride films(13) are removed, and, in order to modulate threshold voltage of device, boron ions are implanted to form boron ion-diffused layers(61). FIG. 1G represents a cross-sectional view of silicon oxide film(71) grown to be used as a gate oxidized layer of NMOS transistor. Polycrystalline silicon (81) to be used as a gate is formed, and patterning is subsequently carried out(see: FIG. 1H).

Then, phosphorous ions are implanted to the substrate(11) to form a phosphorous-diffused layer(91), so that ions are not diffused under the polycrystalline silicon(81) (see: FIG. 1I). As shown in FIG. 1J, silicon oxide film is evaporated on the whole substrate.

And then, the silicon oxide film(101) and the polycrystalline silicon(81) locating in window are removed, as can be seen in FIG. 1K. Chrome(111) and gold(112) are evaporated sequentially, and patterning is carried out(see: FIG. 1L). Silicon oxide film(121) is formed on the resultant substrate (11), and patterning is carried out. FIG. 1M represents a cross-sectional view of the substrate(11).

Referring to FIG. 1N, for electrical wiring of the manufactured NMOS transistor, source/drain contact aperture (131) is formed by patterning and etching, and aluminum (141) is evaporated and patterning is subsequently carried out (see: FIG. 1O). In the course of electrochemical etching, the substrate(11) becomes thinner as a whole, and particularly the substrate becomes thinner in a boundary between devices, which makes it vulnerable to mechanical impacts. To solve the said problem, a transparent glass(151) is attached to the fore-side of the substrate(11) as can be seen in FIG. 1P. Finally, back-side of the substrate is electrochemically etched to form silicon layer, and chrome(111) and gold(112) are removed through the window(161) thus formed, to manufacture a NMOS transistor of SOI-type(see: FIG. 1Q).

Hereinafter, the method for manufacturing the active-driven LCD employing the semiconductor structure of SOI-type is explained with references of FIGS. 2A to 2R.

Figure 2A:
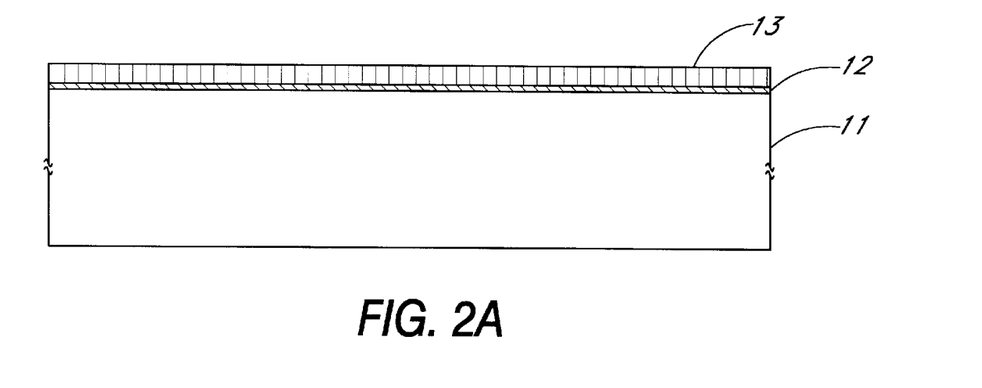
FIGS. 2A to 2R are schematic diagrams showing a method for manufacturing an active-driven liquid crystal display, employing an electrochemical etching method.
Figure 2B:
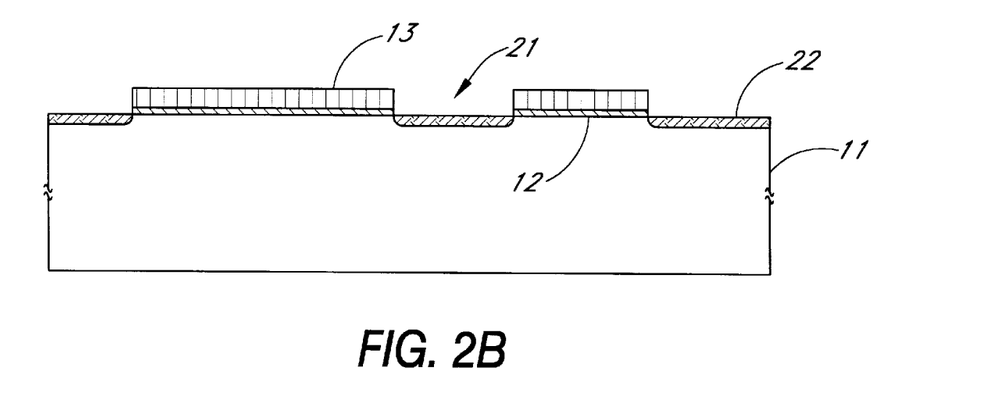
Figure 2C:
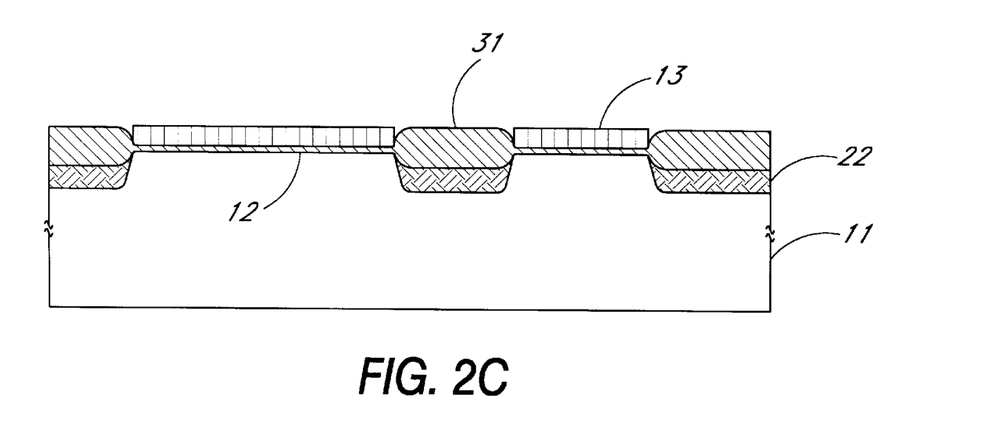

Referring to FIG. 2A, a silicon oxide film(12) is grown on a silicon substrate of p-type(11), and a silicon nitride film (13) is formed on the silicon oxide film(12). Then, as can be seen in FIG. 2B, windows(21) are made on the substrate(11) by removing the silicon oxide film(12) and the silicon nitride film(13), and phosphorous-diffused layers(22) are formed on the silicon substrate(11) exposed by the formation of windows(21). Silicon oxide film(31) is grown on the phosphorous-diffused layers(22) by oxidizing it again at a high temperature, while regions under the silicon nitride film(13) are not oxidized(see: FIG. 2C).

Figure 2D:
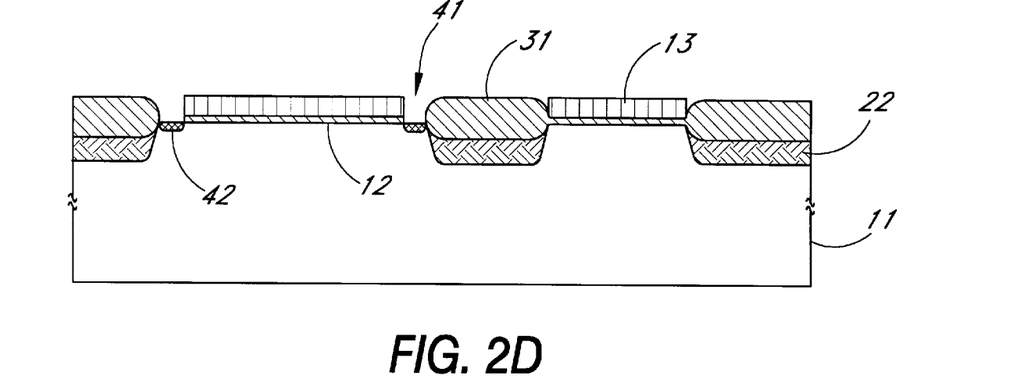
Figure 2E:
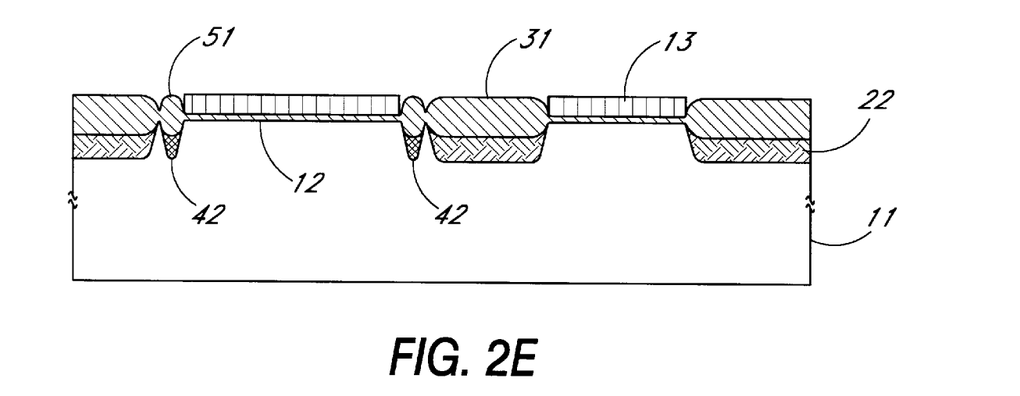

Then, windows(41) are made by removing the silicon oxide film(12) and the silicon nitride film(13) as can be seen in FIG. 2D. Boron ion-diffused layers(42) are formed on the windows(41) and oxidized at a high temperature, to form silicon oxide films(51) for the insulation of NMOS transistor devices for pixel switching(see: FIG. 2E).

Figure 2F:
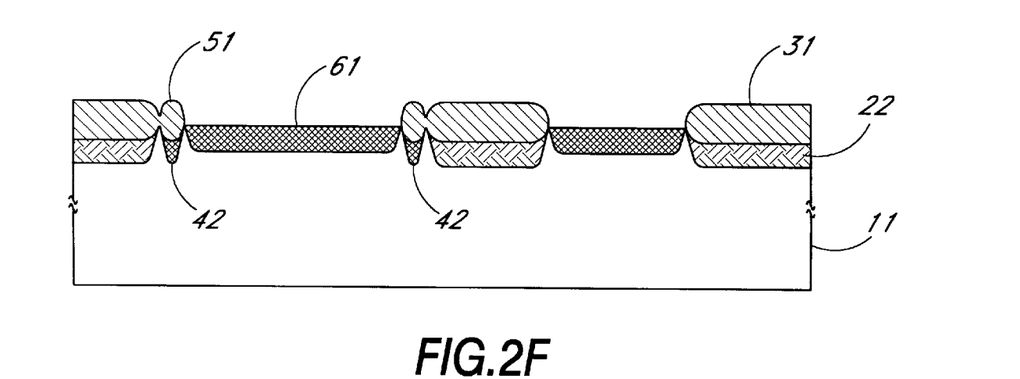
Figure 2G:
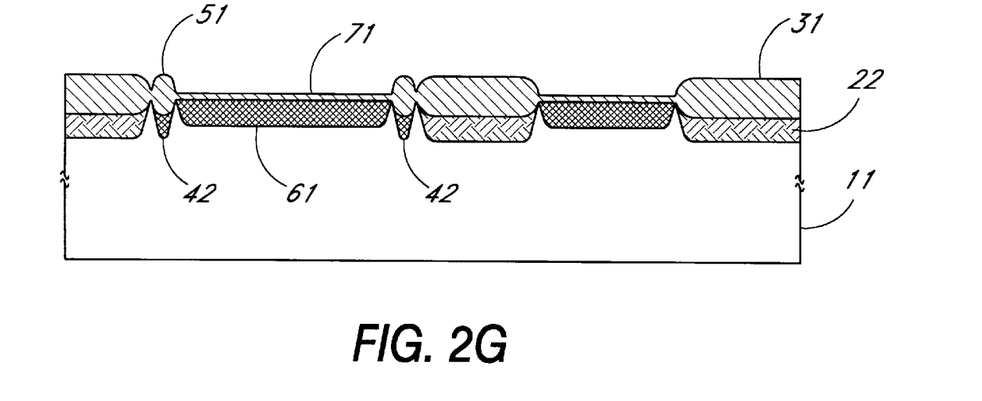
Figure 2H:
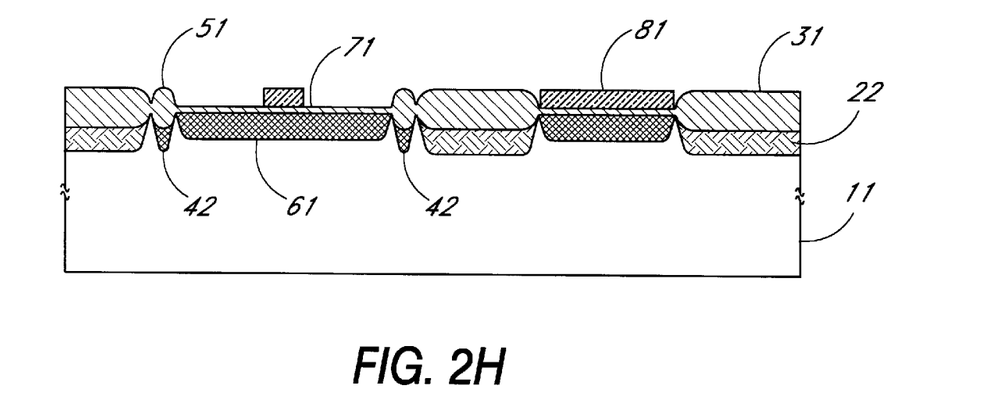

Referring to FIG. 2F, the remaining silicon nitride films (13) and the silicon oxide films(12) under the silicon nitride films(13) are removed, and, in order to modulate threshold voltage of pixel switching devices, boron ions are implanted to form boron ion-diffused layers (61). FIG. 2G represents a cross-sectional view of silicon oxide film(71) grown to be used as a gate oxidized layer of NMOS transistor. Polycrystalline silicon(81) to be used as a gate is formed, and patterning is carried out(see: FIG. 2H).

Figure 2I:
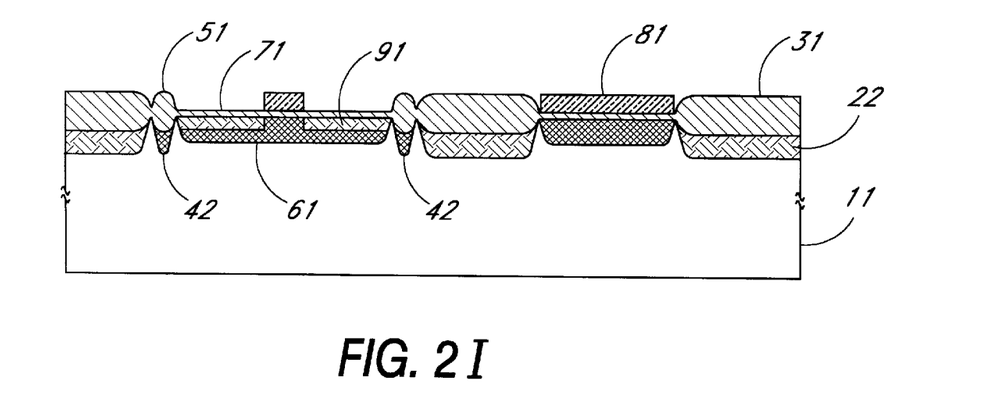
Figure 2J:
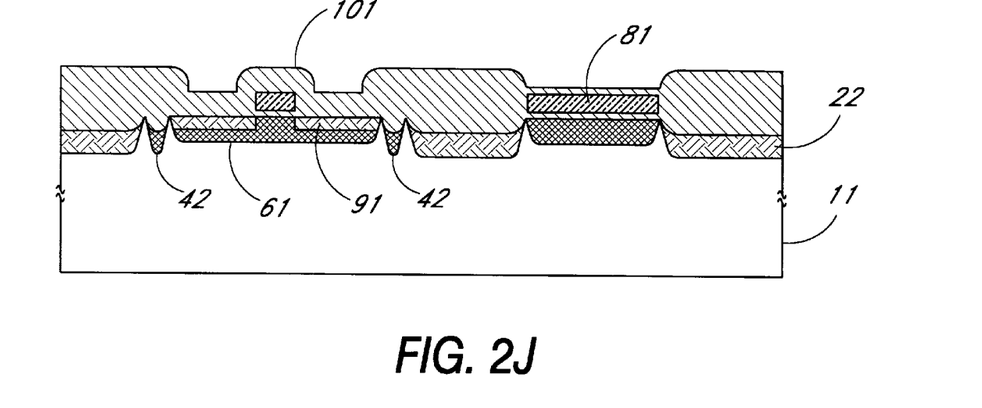

Then, phosphorous ions are implanted to the substrate(11) to form a phosphorous-diffused layer(91), so that ions are not diffused under the polycrystalline silicon(81) (see: FIG. 2I). As shown in FIG. 2J, silicon oxide film(101) is evaporated on the whole substrate.

Figure 2K:
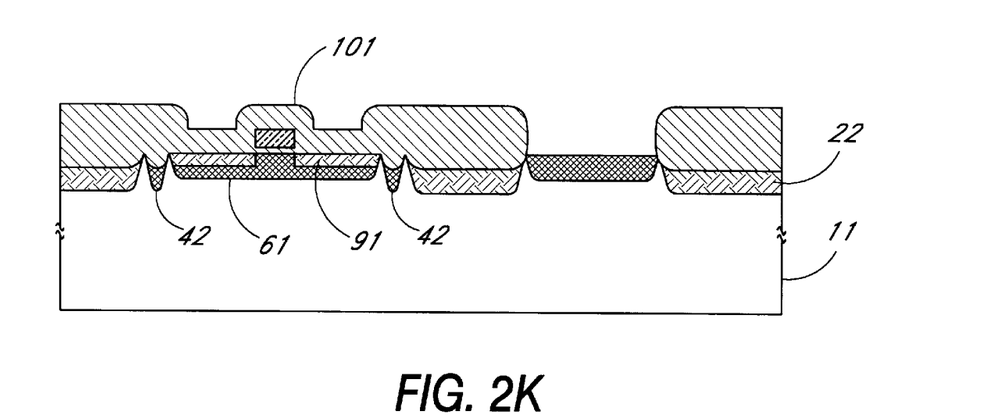
Figure 2L:
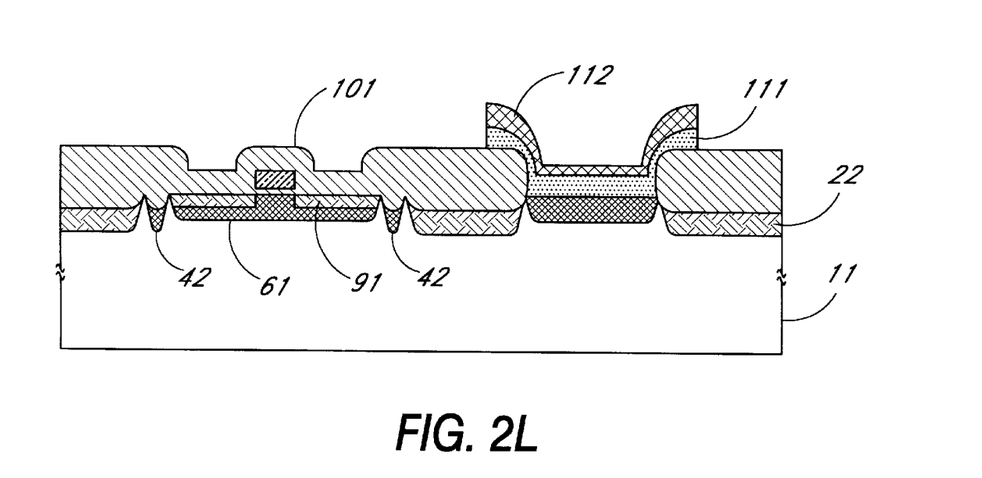
Figure 2M:
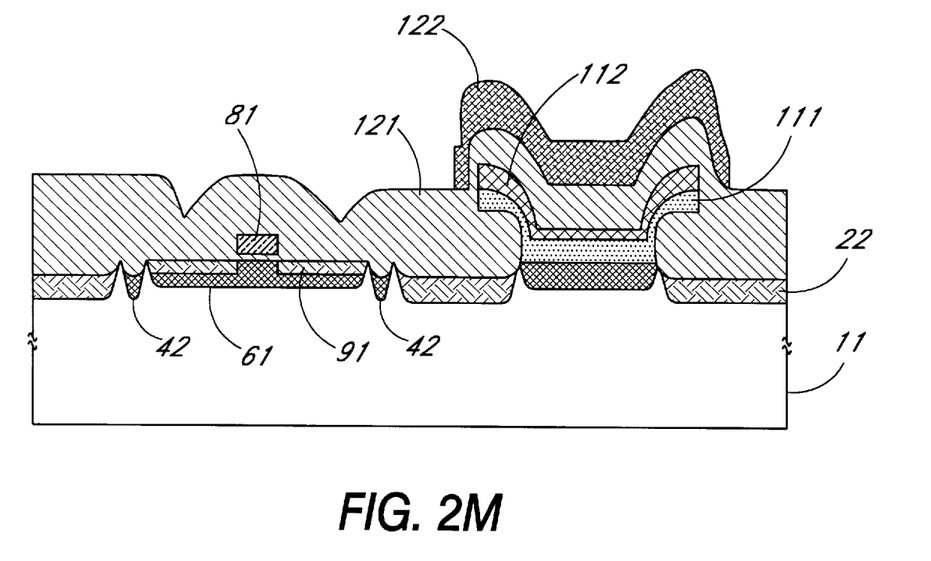

And then, the silicon oxide film(101) and the polycrystalline silicon(81) locating in window are removed, as can be seen in FIG. 2K. Chrome(111) and gold(112) are evaporated sequentially, and patterning is carried out(see: FIG. 2L). Silicon oxide film(121) is formed on the resultant substrate (11). Then, a transparent electrode(122) used for applying voltage to liquid crystal is formed, and patterning is carried out. FIG. 2M represents a cross-sectional view of the substrate(11).

Figure 2N:
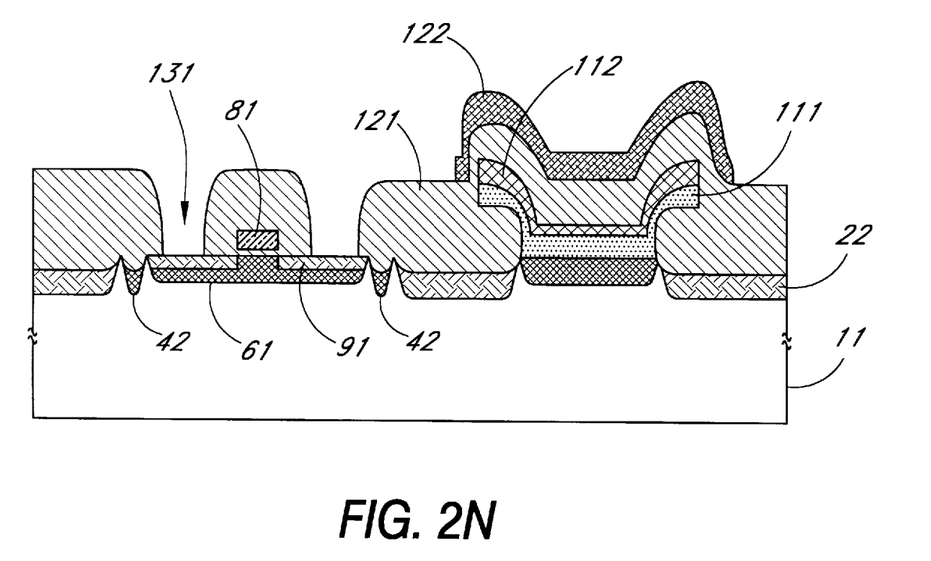
Figure 2O:
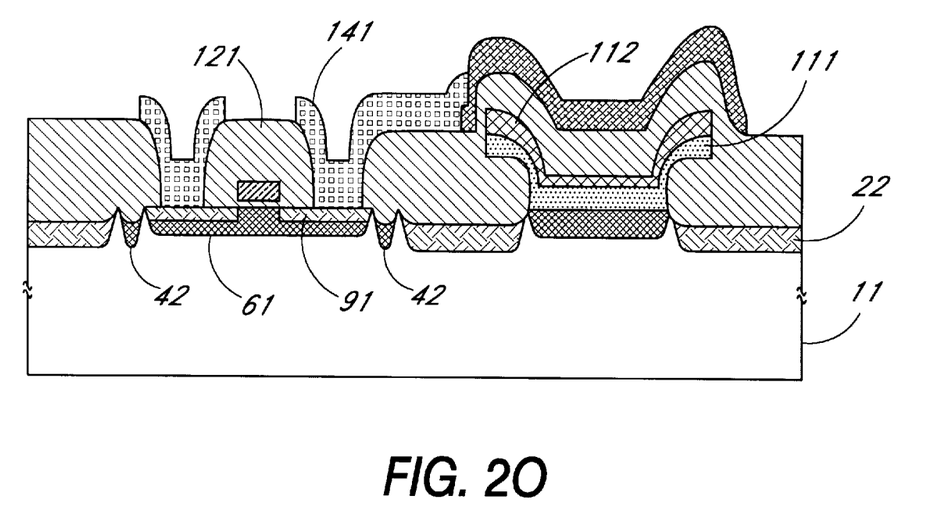
Figure 2P:
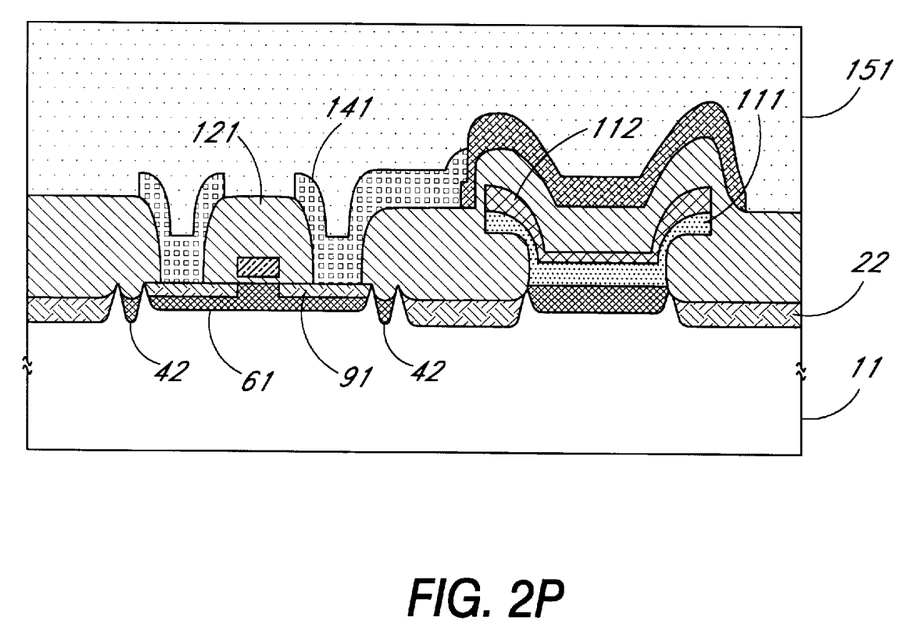
Figure 2Q:
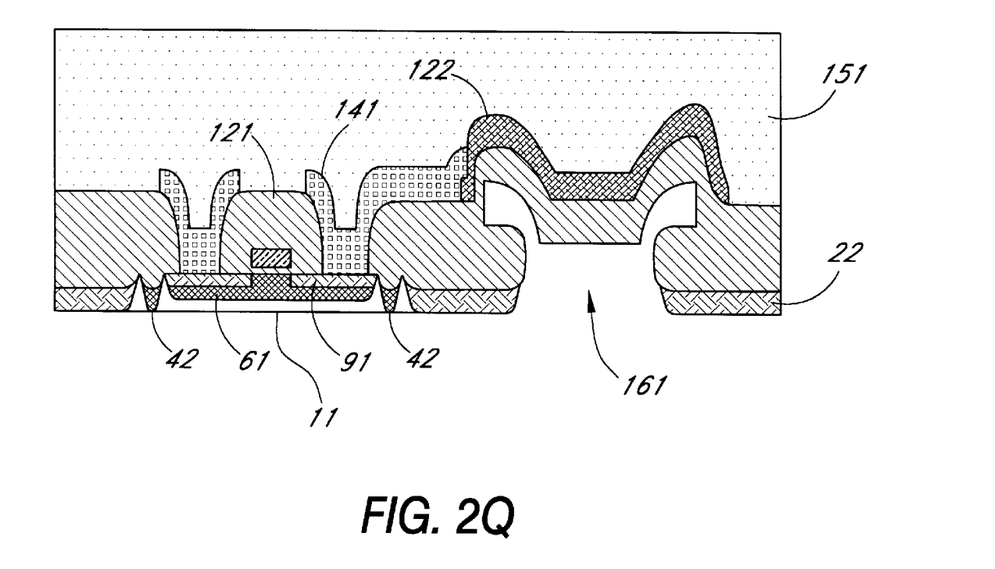
Figure 2R:
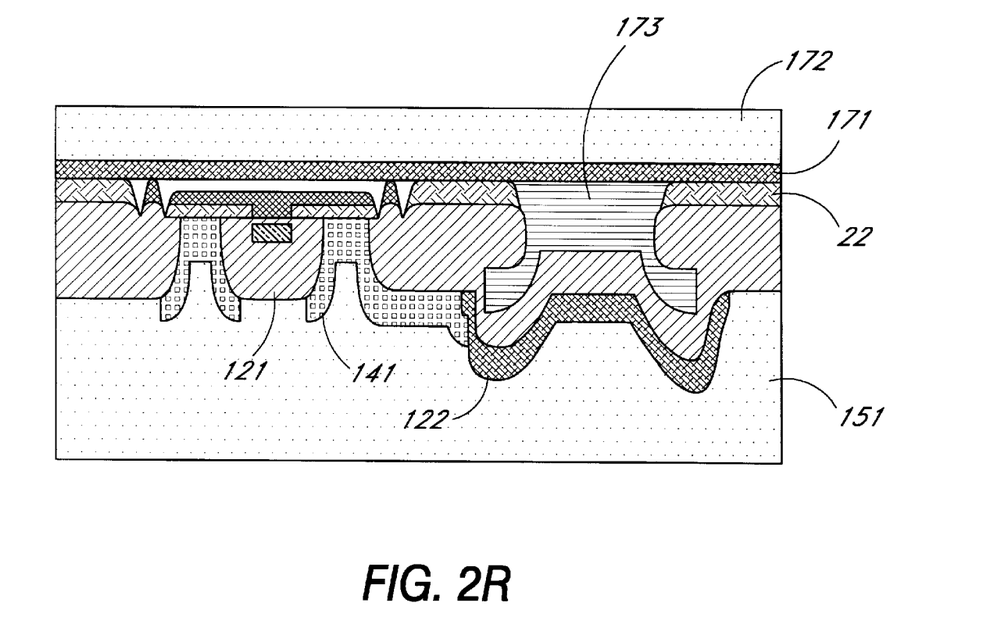

Referring to FIG. 2N, for electrical wiring of the manufactured NMOS transistor, source/drain contact aperture (131) is formed by patterning and etching, and aluminum (141) is evaporated and patterning is followed(see: FIG. 2O). In the course of electrochemical etching, the substrate(11) becomes thinner as a whole, and particularly the substrate becomes thinner in a boundary between pixels, which makes it vulnerable to mechanical impacts. Also, since a protective structure to prevent leakage of the liquid crystal is required, a transparent glass (151) is attached to the fore-side of the substrate (11) (see: FIG. 2P). Back-side of the substrate is electrochemically etched to form silicon layer, and chrome (111) and gold(112) are removed through the window(161) thus formed as shown in FIG. 2Q. A transparent glass(172) having transparent conductive layer(171) is attached to the back-side of the substrate. Finally, liquid crystal(173) is implanted between the silicon substrate and the glass to prepare an active-driven LCD(see: FIG. 2R).

As clearly illustrated and demonstrated above, the present invention provides a method for manufacturing a semiconductor structure having a SOI like structure which is prepared on a silicon substrate by electrochemical etching, and an active-driven liquid crystal display employing the semiconductor device. In accordance with the method for manufacturing the SOI-type semiconductor structure, a device having a good electrical insulation property, low leakage current and small parasitic capacity, like a SOI wafer, can be prepared, by employing a silicon substrate which is cheaper than the SOI substrate. Also, in accordance with the present invention, an active-driven LCD employing the SOI-type semiconductor structure is provided, where the integration of driving circuit and extra circuit is facilitated, and recent semiconductor integration techniques can be employed. Accordingly, the miniaturization, high resolution and high level of integration, can be accomplished, and electric power consumption can be reduced, since it can be operated by low driving voltage. Further, size and location of aperture is elaborately controlled by the automatic arrangement of an etched aperture to a fine structure of the substrate, which makes it vulnerable to chemical and mechanical damage.

What is claimed is:

1. A method of processing a semiconductor structure, comprising:

providing a semiconductor substrate having a first surface and an opposing second surface;

fabricating an electronic circuit on the first surface of the substrate;

forming a conductive material portion on the first surface of the substrate; thereafter, electrochemically etching the substrate from the second surface thereof by using the conductive material portion as one electrode of the electrochemical etching.

2. The method as defined in claim 1, wherein the electrochemical etching is performed such that the second surface of the substrate is immersed into an etching solution and electric current is applied between the conductive material portion and another electrode contacting the etching solution, thereby the substrate is etched from the second surface.

3. The method as defined in claim 1, further comprising, before the electrochemical etching, forming a support layer over the electronic circuit and conductive material portion formed on the first surface of the substrate.

4. The method as defined in claim 3, further comprising, before the formation of the support, forming an insulating layer over the electronic circuit and conductive material portion formed on the first surface of the substrate.

5. The method as defined in claim 1, wherein the conductive material is a metallic material selected from the group consisting of aluminum, tungsten, chrome, nickel, titaniumn, tantalium, copper, gold, platinum and alloy of two or more thereof.

6. The method as defined in claim 1, wherein the conductive material portion is formed in the course of the fabrication of the electronic circuit.

7. The method as defined in claim 1, wherein the conductive material is removed after the electrochemical etching is completed.

8. The method as defined in claim 1, wherein the electronic circuit formed on the first surface of the substrate comprises at least one selected from the group consisting of a diode, a bipolar junction transistor and field effect transistor.

9. The method as defined in claim 1, wherein the support is made of a transparent material.

10. The method as defined in claim 9, wherein the transparent material is glass or quartz.

11. The method as defined in claim 2, wherein the etching solution contains fluoric acid.

12. The method as defined in claim 11, wherein the etching solution further contains nitric acid.

13. The method as defined in claim 2, wherein the electrochemical etching is performed using at least two different etching solutions, immersing the substrate into the different solutions consecutively.

14. The method as defined in claim 1, wherein the semiconductor substrate is a single crystalline silicon substrate.

15. The method of manufacturing a liquid crystal display, comprising the method as defined in claim 1, further comprising:

forming a first transparent, conductive material layer over the conductive material portion;

providing a transparent, insulating support over the electronic circuit and the first transparent, conductive material;

after the electrochemical etching, removing the conductive material portion to expose the first transparent, conductive material layer;

providing a second transparent, conductive material portion over the substrate on an etched side, thereby forming an enclosed space between the first and second transparent, conductive materials at the location where the conductive material portion is removed; and introducing a liquid crystal material into the enclosed space.

16. The method as defined in claim 15, wherein the transparent, conductive material is at least one selected from the group consisting of ITO (indium tin oxide), ZnO, and $SnO_2$.

17. The method as defined in claim 15, wherein the liquid crystal material is twist nematic (TN) liquid crystal or super twist nematic (STN) liquid crystal.

18. The method as defined in claim 15, wherein the transparent, insulating support is made of glass or quartz.

19. The method as defined in claim 15, wherein the transparent, insulating support is provided before the electrochemical etching.

20. The method as defined in claim 15, wherein the first transparent, conductive material portion is electrically connected to the electronic circuit.

* * * * *